United States Patent
Takahashi et al.

(10) Patent No.: US 7,357,879 B2
(45) Date of Patent: Apr. 15, 2008

(54) ETCHING SOLUTION, METHOD OF ETCHING AND PRINTED WIRING BOARD

(75) Inventors: Tsunehisa Takahashi, Gifu (JP); Shigeki Sawa, Gifu (JP); Kazuhiko Matsui, Gifu (JP)

(73) Assignee: Ibiden Co., Ltd., Ogaki-shi (JP)

( * ) Notice: Subject to any disclaimer, the term of this patent is extended or adjusted under 35 U.S.C. 154(b) by 174 days.

(21) Appl. No.: 10/560,421

(22) PCT Filed: Mar. 1, 2005

(86) PCT No.: PCT/JP2005/003832

§ 371 (c)(1),
(2), (4) Date: Dec. 14, 2005

(87) PCT Pub. No.: WO2005/086551

PCT Pub. Date: Sep. 15, 2005

(65) Prior Publication Data

US 2006/0199394 A1    Sep. 7, 2006

(30) Foreign Application Priority Data

Mar. 3, 2004 (JP) .............................. 2004-059411

(51) Int. Cl.
*B44C 1/22* (2006.01)
*C03C 15/00* (2006.01)
*C03C 25/68* (2006.01)
*C23F 1/00* (2006.01)
*C25F 3/00* (2006.01)

(52) U.S. Cl. .................... 216/105; 252/79.1; 252/79.2; 216/106; 216/13

(58) Field of Classification Search ................ 216/105, 216/106, 13; 252/79.1, 79.2
See application file for complete search history.

(56) References Cited

FOREIGN PATENT DOCUMENTS

| DE | 2557269 A | * | 6/1977 |
|---|---|---|---|
| JP | 59-222584 | | 12/1984 |
| JP | 05-072724 | | 3/1993 |
| JP | 05-140491 | | 6/1993 |
| JP | 06-057453 | | 3/1994 |
| JP | 07-066528 | | 3/1995 |
| JP | 2003-306784 | | 10/2003 |

* cited by examiner

*Primary Examiner*—Roberts Culbert
(74) *Attorney, Agent, or Firm*—Oblon, Spivak, McClelland, Maier & Neustadt, P.C.

(57) ABSTRACT

There is provided an etching solution comprised of a cupric chloride solution and a high-concentration triazole type compound added to the cupric chloride solution and capable of forming an etching-inhibiting coating. In a process of forming a circuit pattern by etching with the etching solution, an etching-inhibiting coating is selected formed on parts of a copper foil laid under the edge of an etching resist to effectively inhibit horizontal side-etching of the copper foil from the edge of the etching resist. Also, nonuniform irregularities formed on the side wall of the circuit pattern by the etching improves the adhesion between the circuit pattern and an insulating resin layer covering the circuit pattern.

17 Claims, 8 Drawing Sheets

Fig.3(A)

Etching reaction process
(Prior art)

(1) $CuCl_2 + Cu \rightleftharpoons 2CuCl$ ← (staying as cuprous chloride on surface)

(2) $2CuCl + 2HCl \rightleftharpoons 2CuCl_2^- + 2H^+$ Released as complex into liquid (3) $2CuCl_2^- + H_2O_2 \rightleftharpoons 2CuCl_2 + H_2O + 1/2 O_2$ (restored by hydrogen peroxide to cupric chloride)

Fig.3(B)

Etching reaction process
(Present invention)

(1) $CuCl_2 + Cu \rightleftharpoons 2CuCl$
$K(B) \rightleftharpoons Cu$ (adsorption) ← Additive (2) $2CuCl + 2HCl \rightleftharpoons 2CuCl_2^- + 2H^+$ Etching-Inhibiting Coating
$K(B) + Cu^+ \rightleftharpoons \boxed{Cu^+ + K(B)}$ (3) $2CuCl_2^- + H_2O_2$ Etching-Inhibiting Coating $\rightleftharpoons 2CuCl_2 + H_2O + 1/2 O_2$
$\boxed{Cu^+ + K(B)} + HCl \rightleftharpoons CuCl_2^- + K(B)$ Fig.4(A)  STRUCTURE  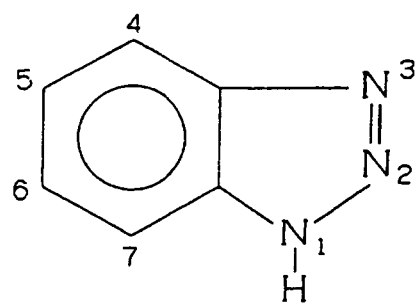
Fig.4(B)  BTA  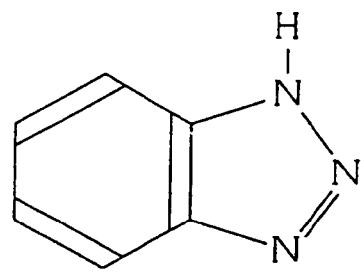
Fig.4(C)  TTA  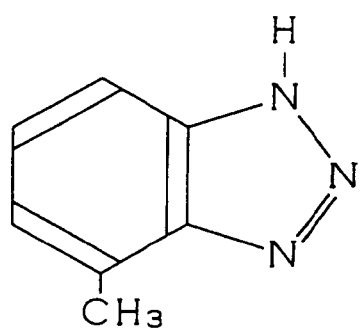
Fig.4(D)  BTA-COOH  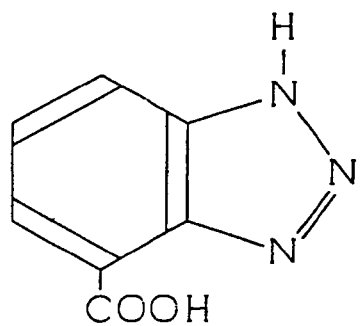

Fig. 6
Configuration of wiring pattern
(Prior art)
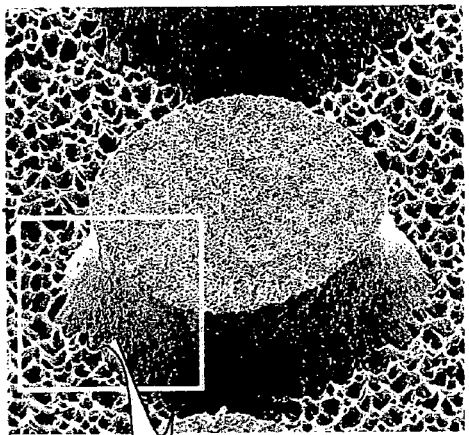
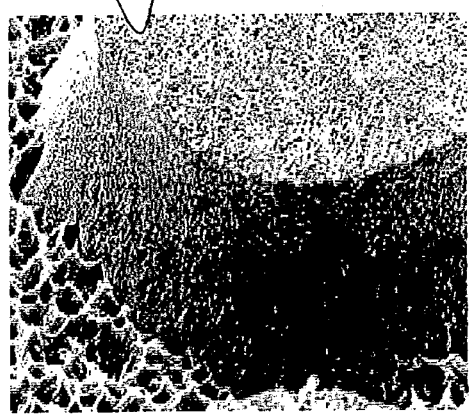
Fig. 7
Configuration of wiring pattern
(Present invention)
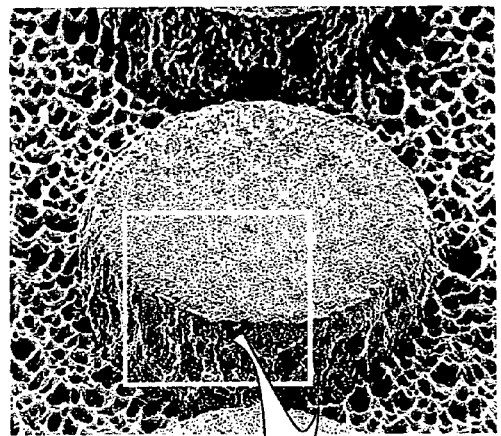
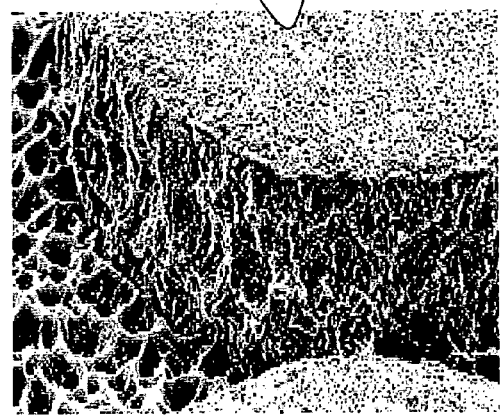
Fig. 8
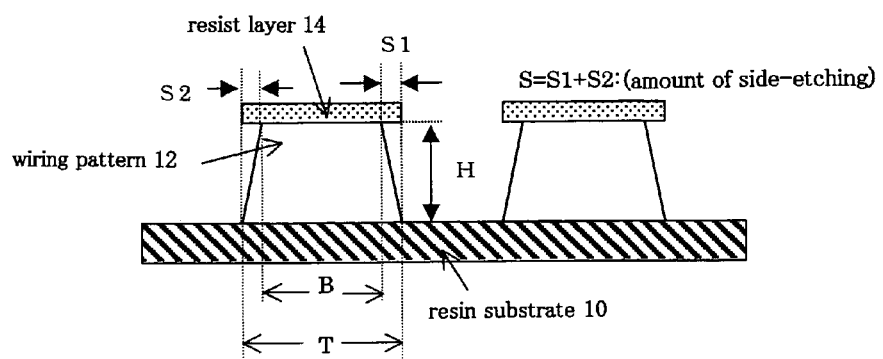

Fig. 9(A) (After etching)
Prior art
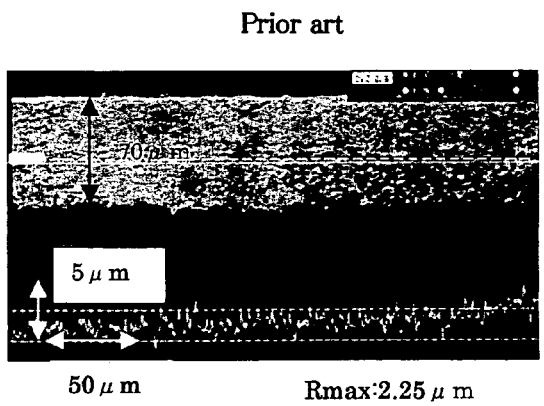
50 μm     Rmax:2.25 μm
Fig. 10(A) (After etching)
Present invention
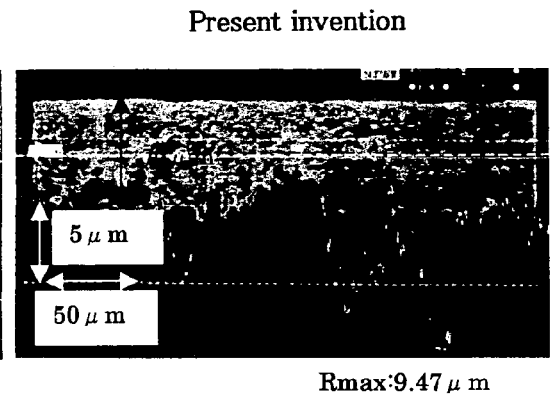
Rmax:9.47 μm
Fig. 9(B) (After CZ roughing processing)
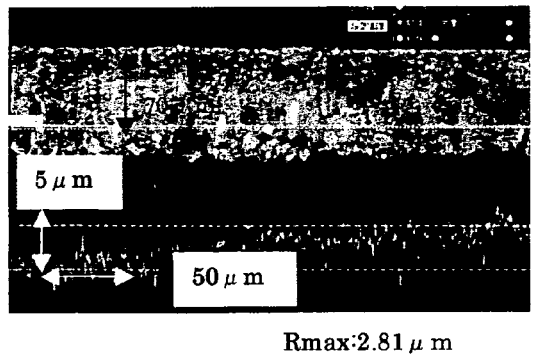
Rmax:2.81 μm
Fig. 10(B) (After CZ roughing processing)
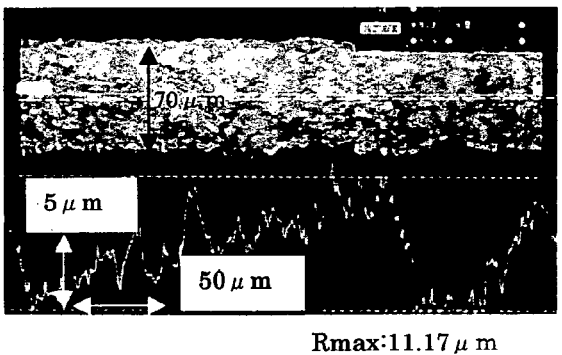
Rmax:11.17 μm
Fig. 9(C) (After blackening process)
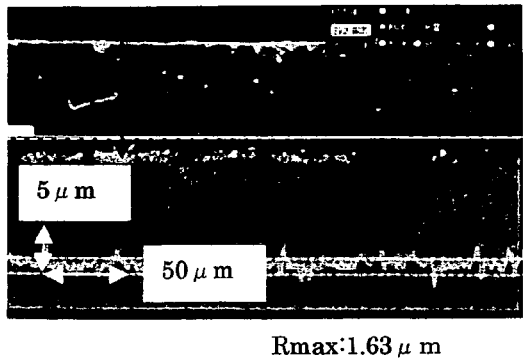
Rmax:1.63 μm
Fig. 10(C) (After blackening process)
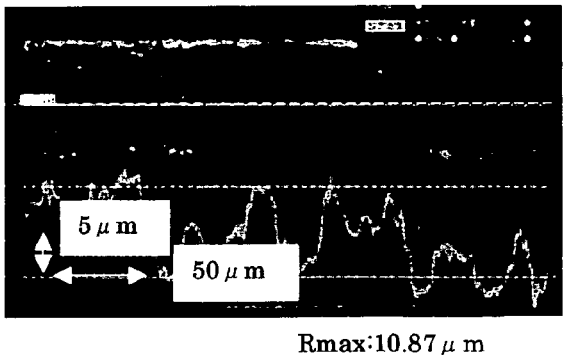
Rmax:10.87 μm

ETCHING SOLUTION, METHOD OF ETCHING AND PRINTED WIRING BOARD

FIELD OF THE INVENTION

The present invention generally relates to an etching solution intended for use in the process of etching a copper layer to form an electrical circuit, and more particularly to an etching solution having mixed therein an additive containing a component that will form a coating effectively inhibiting the etching, and which is thus capable of anisotropic etching (high etch factor) even in processing a metallic material such as copper, an etching method in which the etching solution is used, and to a printed wiring board having a wiring pattern formed by the etching method.

BACKGROUND ART

With the recent remarkable innovation of the electronics, the industries of printed wiring boards are strictly urged to provide inexpensive high-density wiring boards. However, etching in the conventional subtractive method (tinting method) permits isotropic forming of a circuit pattern. With this etching technique, it is difficult to make etching in any intended direction, and provide inexpensive high-density wiring boards.

First, forming a circuit pattern by the conventional subtractive method will be described with reference to FIGS. 1(A) to 1(E):

(1) An etching resist 14 having a predetermined pattern is formed on a copper foil 12 bonded to a resin substrate 10 (as in FIG. 1(A)).

(2) Part, not covered with the etching resist 14, of the copper foil 12 is solved and removed with an etching solution that will solve the copper foil 12 to form a circuit pattern 16 (as in FIGS. 1(B) to 1(D)).

(3) The etching resist 14 remaining on the circuit pattern 16 is removed to complete the circuit pattern 16 (as in FIG. 1(E)).

As will be seen, the above anisotropic etching results in the circuit pattern 16 formed from the copper (Cu) foil 12 whose part covered with the etching resist 14 is excessively etched horizontally. This horizontal excessive etching is called "side etching". Since a wiring interval should be determined taking the side etching in consideration in designing a high-density wiring, it is difficult to attain a high density of wiring. Therefore, an additive method by which a circuit pattern can expectantly be formed in a desired direction to a high density of wiring has been attracting attention in the field of art. However, the conventional additive method includes complicated processes and thus cannot have yielded any inexpensive printed wiring boards as final products. In this situation, it has been awaited to propose a novel processing technology using the subtractive method to provide inexpensive printed wiring boards.

For example, the Japanese Patent Application Laid Open No. 57453 of 1994 discloses a copper or copper-alloy etching component containing cupric chloride (or copper alloy), hydrochloric acid, 2-aminobenzothiazole compound and polyethylene glycol and an etching composition containing, in addition to the above etching composition, polyamine compound and its hydrochloride, sulfate and phosphate.

Also, the Japanese Patent Application Laid Open No. 2003-306784 discloses an additive that inhibits the side etching made by a ferric-chloride etching solution. This additive containing one or two or more different ones selected from among a heterocyclic compound having a carbonyl group or carboxyl group, a group of glycols each having a triple bond or a compound in which ethylene oxide is added to active hydrogen of the glycol, an alkyl sarcosine or its alkali metal salt, and anhydrate of aromatic carboxylic acid, and also at least one of thiazoles or triazoles. Also, in the Japanese Patent Application Laid Open No. 2003-306784, it is stated that the side etching-inhibiting additive may contain, as a dispersant, a well-known nonionic surface active agent, anionic surface active agent, alkyl glycol, glycol ether or the like.

However, although the Japanese Patent Application Laid Open Nos. 2003-306784 and 2003-306784 discloses the additive that will inhibit the side etching made by the cupric chloride and ferric chloride in the etching process, a most effective one selected from among such additives attains such an inhibition about 30% higher than with the conventional etching solutions and this effect of side-etching inhibition is not sufficient for forming a high-density wiring.

DISCLOSURE OF THE INVENTION

The present invention has an object to overcome the above-mentioned drawbacks of the related art by providing an etching solution containing a side etching-inhibiting additive permitting to form a fine-pitch circuit pattern, an etching method in which this etching solution is used, and a printed wiring board having a circuit pattern formed by the etching method.

To attain the above object, the Inventors of the present invention had devoted themselves to attaining the above object. Finding the fact that a high-concentration organic compound added to an etching solution prepared from a solution based on cupric chloride selectively produced, on part of a copper foil laid under the edge of an etching resist, an etching-inhibiting coating that effectively inhibits the copper foil from being etched horizontally (side etching) from the edge of the etching resist, the inventors worked out the present invention that will be described below:

(1) The above object can be attained by providing an etching solution comprised of a solution based on cupric chloride (this solution will be referred to as "cupric chloride solution" hereunder) and a triazole type compound added to the cupric chloride solution.

(2) Also the above object can be attained by providing an etching method of etching a copper layer coated with an etching resist having a predetermined pattern using an etching solution, wherein an etching solution comprised of a solution based on cupric chloride and a triazole type compound added to the cupric chloride solution is supplied to parts of the copper layer exposed between traces of the etching resist pattern, and the copper layer parts not covered with the etching resist are etched while an etching-inhibiting coating is selectively formed on the copper layer part laid under edges of the etching resist.

(3) Also the above object can be attained by providing an etching method of etching a copper layer coated with an etching resist having a predetermined pattern using an etching solution, wherein an etching solution comprised of a solution based on cupric chloride and a triazole type compound and at least either amphoteric or anionic surface active agent added to the cupric chloride solution is supplied to parts of the copper layer exposed between traces of the etching resist pattern, and the copper layer parts not covered with the etching resist are etched while an etching-inhibiting coating is selectively formed on the copper layer part laid under the edge of the etching resist.

According to the present invention, a triazole type compound capable of effectively forming a coating that effectively inhibits etching is added in a high concentration to a conventional cupric-chloride etching solution based on cupric chloride, and a copper layer or foil (will be referred to simply as "copper layer" hereunder) not covered with any etching resist is etched in the direction of thickness with the etching solution in the etching step while an etching-inhibiting coating is selectively reaction-deposited on part of the copper layer laid nearly just under the edge of the etching resist, to attain a considerably improved effect of side-etching inhibition.

Thus, a fine-pitch circuit pattern whose traces are extremely fine can be formed by etching nearly as designed without adopting any additive method that can provide expensive printed wiring boards. Therefore, it is possible to form a high-density circuit pattern having the extremely fine traces, which leads to a higher wiring density of a printed wiring board.

The etching solution according to the present invention is comprised of a conventional cupric-chloride etching solution and a hardly water-soluble triazole type compound solved in a concentration of higher than 1000 ppm in the conventional etching solution. In the etching using this etching solution according to the present invention, the high-concentration triazole type compound in the etching solution reacts with the copper to produce a complex. It is inferred that since the liquid pressure on the copper layer surface not covered with the etching resist is relatively high, etching-inhibiting coatings will hardly be reaction-deposited on the bare copper layer surface while they will effectively be on the copper layer laid under edges of the etching resist.

As proved by the results of the experiments having been done by the inventors of the present invention, the effect of side-etching inhibition in the etching using the etching solution according to the present invention is two to three times higher than that (on the order of 30%) in the etching using the etching solution disclosed in the Japanese Patent Application Laid Open No. 2003-306784. That is, the effect of side-etching inhibition of the etching solution according to the present invention is 80 to 90%.

According to the present invention, the triazole type compound can be solved in a high concentration in the above-mentioned etching solution using the surface active agent or using a strong alkali or acid in stead of the surface active agent. Both these methods are nearly equal in effect to each other.

In case a surface active agent is used as above, an amphoteric or anionic surface active agent is added to water, they are mixed, and then a triazole type compound is added to the mixture, the resulted mixture is agitated until they are completely solved. The resulted product is used as an additive.

Also, in case no surface active agent is used as above, a triazole type compound is added to an aqueous solution of strong alkali (KOH solution of pH 13, for example), the mixture is agitated until they are completely solved. The resulted product is used as an additive. In this case, the type triazole type compound should preferably be solved in such a proportion in the strong-alkali aqueous solution that its acescence will neutralize the aqueous solution as much as possible.

The etching solution according to the present invention can be produced by adding, to the cupric chloride solution, an additive containing mainly the triazole type compound prepared by the above method in case the concentration of each of the triazole type compound and surface active agent in the etching solution is within a predetermined range, the triazole type compound can be dispersed and solved homogeneously in the cupric chloride solution.

The concentration of the triazole type compound in the etching solution should preferably be over 1000 ppm and under 3000 ppm, and more preferably in a range of 1200 to 2500 ppm.

If the concentration is under 1000 ppm, no sufficient inhibiting coating will be formed with occurrence of excessive side etching. On the other hand, if the concentration is over 3000 ppm, excessive inhibiting coating will be formed with production of excessive inhibiting coating that will excessively inhibit the side etching as well as the etching in the direction of depth.

Note that even a concentration of more than 3000 ppm will initiate the etching in the direction of depth when the spray pressure of etching is used at the high-pressure side. In this case, however, a spray pressure lower than 0.1 to 0.6 MPa will not lead to any practical inhibition of etching.

The concentration of a surface active agent added to the etching solution according to the present invention in some cases should preferably be within a range of 2000 to 11000 ppm, and more preferably within a range of 4000 to 9700 ppm.

A concentration of less than 2000 ppm is insufficient to reduce rapid reaction of the triazole type compound on the copper layer surface with the surface active agent so that it is difficult to form any uniform etching-inhibiting coating on the side walls of the copper pattern layer. On the other hand, a concentration of more than 11000 ppm is necessary and sufficient, or more than that, for reducing rapid reaction of the triazole type compound. The surface active agent of such concentration will produce excessive foams due to spray or the like, although its performance will not change so much. With such foams, the surface active agent of more than 11000 ppm in concentration is not suitably usable as an additive to the etching solution.

Etching a copper layer with the etching solution according to the present invention is apt to be influenced by a temperature of the etching solution. The temperature should preferably be lower than 50° C. If the etching-solution temperature is higher than 50° C., the etching-inhibiting coating will be produced but cannot easily be made to stably adhere to the copper layer surface because the etching performance (activity) of copper chloride will be rather prevailing.

The etching-solution temperature should preferably be within a range of about 20 to 30° C. at which the etching can be made most effectively.

Being in contact with the etching solution according to the present invention, the etching-inhibiting coating formed on the copper layer not covered with the etching resist is separated when applied with an external pressure such as a liquid flow, solved in hydrochloric acid and thus can partially be removed. On this account, the etch apparatus in which the etching solution according to the present invention is used should be of such a spray type as is capable of varying the external pressure such as a liquid flow or air pressure. Also, the etch apparatus should preferably be capable of varying the etching conditions such as solution temperature, pressure, oscillation, vibration, etc. although the condition under which the etching-inhibiting coating remains on the side walls of the copper layer pattern is not known.

Note that by adding the predetermined amount of surface active agent to the etching solution according to the present invention, it is possible to lower the external pressure such as a sufficient liquid flow or the like to separate the etching-inhibiting coating formed on the copper layer not covered with the etching resist. More particularly, in an etching process using the etching solution having a surface active agent added thereto, the etching-inhibiting coating can be sufficiently separated under a spray pressure of about 0.1 to 0.3 Mpa. However, in an etching process using the etching solution having no surface active agent added thereto, a higher spray pressure of about 0.3 to 0.6 MPa can be used to effectively separate the etching-inhibiting coating.

According to the present invention, the triazole type compound as the additive may be one or two or more different ones selected from among benzotriazole (BTA), BTA-COOH and tolyltriazole (TTA).

According to the present invention, in addition to the triazole type compound, at least either amphoteric or anionic surface active agent may be included in the cupric chloride solution.

The amphoteric surface active agent may be at least one selected from among carboxy betaine type alkylbetaine (alkyldimethyl betaine aminoacetate, alkyldimethyl betaine acetate, alkyldimetyl carboxymethyl betaine, alkyldimethyl carboxymethylene ammonium betaine and alklydimethyl ammonium acetate), and fatty amide propylbetaine (fatty amide propyl dimethyl betaine aminoacetate, alkyl amide propyl betaine, alkyloyl amide propyl dimethyl glycine, alkanoyl aminopropyl dimethyl ammonium acetate, palm oil fatty amide propyl betaine and palm oil fatty amide propyl dimethyl betaine aminoacetate).

The anionic surface active agent may be one or two or more different ones selected from among alcohol ethoxylate [AE](polyoxyethylene alkyl ether and alkyl polyoxyethylene ether), polyoxyethylene (polyoxyethylene polyoxypropylene), polyoxypropylene glycol (polyoxyethylene polyoxypropylene glycol ether, polypropylene glycol polyethylene glycol ether and polyoxyalkylene block polymer), fatty polyethylene glycol (acyl polyethylene glycol, polyethylene glycol fatty acid ester, polyoxyethylene glycol fatty acid ester, PEG fatty acid ester, polyoxyethylene alkanoate [alkanoate] and alkyl carbonyl oxypolyoxyethylene) and fatty polyoxyethylene sorbitan (acyl polyoxyethylene sorbitan, polyoxyethylene sorbitan[mono-tri], alkanoate, polyoxyethylene hexythane fatty acid ester, sorbitan fatty acid fatty acid ester polyethylene glycol ether and POE sorbitan [mono-tri] fatty acid ester [polysorbate]).

(4) Also the above object can be attained by providing a printed wiring board having a circuit pattern formed by either the etching method (2) or (3) above, wherein on the side walls of the circuit pattern, there are formed nonuniform irregularities that improve the adhesion between the circuit pattern and an insulating resin layer covering the circuit pattern. That is, by stacking printed wiring boards each having a circuit pattern having such nonuniform irregularities formed on the side walls thereof one on the other with an insulating resin layer (adhesive layer) such as a resin film, prepreg or the like being laid between the printed wiring boards, it is possible to provide a multilayer printed wiring board superior in adhesion between a conductor layer and insulating layer.

The nonuniform irregularities have a shape and size that depend upon the concentration of the triazole type compound added to the etching solution, concentration of the surface active agent or spray pressure of the etching solution, and are comprised of primary depressions including many convexities (large ones) extending irregularly from the surface of the circuit pattern toward the surface of a substrate and concavities existing between the convexities, and secondary depressions including smaller irregularities existing between the concavities and convexities included in the primary depressions.

The distance between the large convexities, namely, the pitch of the primary depressions, should desirably be on the order of 5 to 20 µm, and distance between the large concavity and concavity, namely, the depth of the primary depressions, should desirably be on the order of 5 to 15 µm. Further, the distance from the convexity to concavity of the small irregularities, that is, the depth of the secondary depressions, should desirably be about ¹/₁₀ to ½ of the depth of the primary depressions.

BRIEF DESCRIPTION OF THE DRAWINGS

FIG. 3(A) schematically illustrates the reaction process in the etching with a conventional etching solution, and FIG. 3(B) schematically illustrate the reaction process in the etching with the etching solution according to the present invention.

FIGS. 4(A) to 4(D) show structural formulas expressing triazole type compounds included in the etching solution according to the present invention.

FIG. 6 shows SEM (scanning electron microscope) micrograms of a wiring pattern (pad) formed using the conventional cupric chloride etching solution, showing the side wall of the wiring pattern in an enlarged scale.

FIG. 7 shows SEM (scanning electron microscope) micrograms of a wiring pattern (pads) formed using the cupric chloride etching solution according to the present invention, showing the irregularities on the side wall of the wiring pattern in an enlarged scale.

FIG. 8 schematically illustrate the etch factor.

FIGS. 9 (A) to 9(C) shows the pictures of the surface roughness of the side wall of the wiring pattern (pad) formed with the conventional etching solution based on cupric chloride, the top picture showing the surface roughness of the etched wiring patter the middle picture showing the surface roughness of the wiring pattern subjected to CZ processing (roughing) after being etched, and the bottom picture showing the surface roughness of the wiring pattern blackened after being etched.

FIGS. 10(A) to 10(C) shows the pictures of the surface roughness of the side wall of the wiring pattern (pad) formed with the etching solution according to the present invention, the top picture showing the surface roughness of the etched wiring pattern, the middle picture showing the surface roughness of the wiring pattern subjected to CZ processing (roughing) after being etched, and the bottom picture showing the surface roughness of the wiring pattern blackened after being etched.

BEST MODE FOR CARRYING OUT THE INVENTION

Figure 1A:
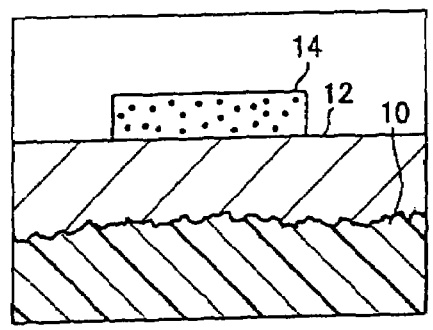
FIGS. 1(A) to 1(E) schematically illustrate the conventional etching method.
Figure 1B:
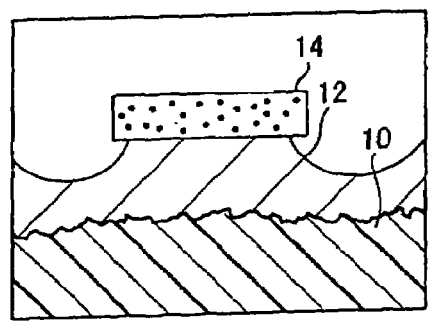
Figure 1C:
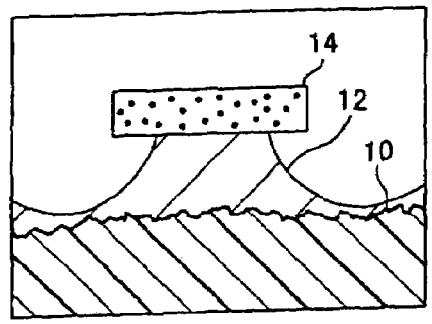
Figure 1D:
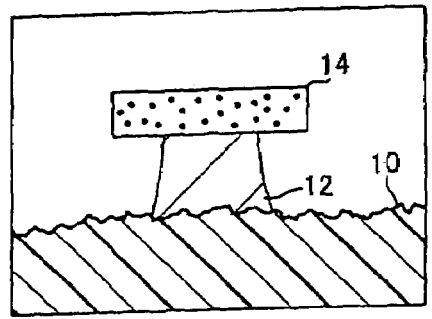
Figure 1E:
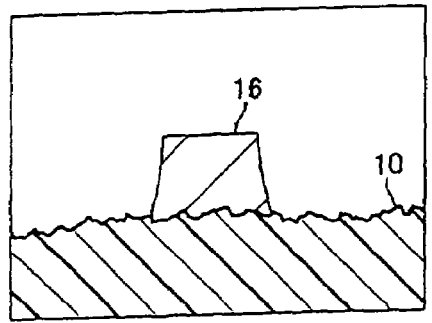

The etching solution according to the present invention is characterized in that a high-concentration triazole type compound capable of forming a coating having an effect of etching inhibition is added to the conventional etching solution based on cupric chloride.

The concentration of the triazole type compound included in the etching solution should preferably be over 1000 ppm and under 3000 ppm, and more preferably within a range of 1200 to 2500 ppm. A concentration of the triazole type compound of more than 3000 ppm will yield an excessive etching-inhibiting coating to excessively inhibit the side etching as well as etching in the direction of depth. Namely, with such a high concentration of the triazole type compound will stop the etching itself. Note that even the concentration of more than 3000 ppm will initiate the etching in the direction of depth when the spray pressure of etching is used at the high-pressure side. In this case, however, it is assumed the spray pressure of etching higher than the practical one (0.1 to 0.6 MPa), which will not lead to any practical inhibition of etching. On the other hand, if the concentration is under 1000 ppm, no sufficient inhibiting coating will be formed with occurrence of excessive side etching.

The triazole type compound may be at least one selected from among benzotriazole (1.2.3.-benzotriazole, BTA), BTA-COOH and tolyl triazole (TTA).

The benzotriazole (BTA) has the structure of a heterocyclic benzene compound in which hydrogen is bonded in one place as shown in FIG. 4(A), and its derivative may be one having, for example, a structure as shown in FIG. 4(B) or TTA having a structure as shown in FIG. 4(C). Further, the benzotriazole (BTA) may be a BTA.carboxylic acid (BTA-COOH) or a BTA-COOH ester ($CH_3^-$, $C_4H_9^-$ ester) as shown in FIG. 4(D).

The triazole type compound in such an etching solution reacts with cuprous chloride ions to form a polymer-like etching-inhibiting coating (CuCl-BTA complex or Cu-BTA complex). It is inferred as above how the etching solution containing the surface active agent forms the etching-inhibiting coating.

In the etching solution, Cu-BTA or CuCl-BTA is dispersed stably as crystals under the action of the surface active agent. When the etching solution is sprayed to the exposed surface of the copper foil, not covered with the etching resist, etching will start downward perpendicularly to the copper layer surface, while etching will also start horizontally in a direction toward beneath the etching resist. In this process, since Cu-BTA or CuCl-BTA is blocked from adhering to the copper layer surface under the action of the surface active agent in the etching solution, it will be forced by the flow of sprayed solution to flow from the copper layer part not covered with the etching resist in the direction toward beneath the etching resist. It is inferred that the etching-inhibiting coating is formed as will be described below. Namely, Cu-BTA or CuCl-BTA in the solution flow will stay at a standing pool beneath the etching resist. This staying will allow a reaction time for which Cu-BTA or CuCl-BTA will adhere to the copper layer surface. The Cu-BTA or CuCl-BTA thus adhering to the copper layer surface is a core of the etching-inhibiting coating and the coating further grows through repetition of the adherence. The etching-inhibiting coating including the Cu-BTA complex or CuCl-BTA complex will selectively be formed downward from beneath the etching resist (in the direction of the side wall).

On the other hand, a relatively high pressure of the etching solution on the copper layer surface not covered with the etching resist will prevent Cu-BTA or CuCl-BTA from reacting with the cuprous chloride ions for a sufficient length of the reaction time, and will make it difficult to form the etching-inhibiting coating. The etching-inhibiting coating, if any formed, will be separated and removed under the solution pressure.

According to the present invention, the surface active agent may be of either an anionic type and/or amphoteric type which will be described below:

(I) Anionic surface active agent
 (a) Ether type
  (1) Alcohol ethoxylate [AE]

Polyoxyethylene alkyl ether
   Alkyl polyoxyethylene ether
   Polyoxyethylene
  (2) Polyoxypropylene glycol

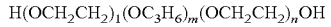

Polyoxyethylene polyoxypropylene
   Polyoxyethylene polyoxypropylene glycol ether
   Polypropylene glycol polyethylene glycol ether
   Polyoxyalkylene block polymer
 (b) Ester ether type
  (1) Fatty acid polyethylene glycol

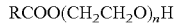

Acyl polyethylene glycol
   Polyethylene glycol fatty acid ester
   Polyoxyethylene glycol fatty acid ester
   PEG fatty acid ester
   Polyoxyethylene alkanoate [alkanoate]
   Alkyl carbonyl oxypolyoxyethylene
  (2) Fatty polyoxyethylene sorbitan
   Acyl polyoxyethylene sorbitan
   Polyoxyethylene sorbitan [mono-tri]
   Alkanoate [alkanoate]
   Polyoxyethylene hexythane fatty acid ester
   Sorbitan fatty acid ester polyethylene glycol ether
   POE sorbitan [mono-tri] fatty acid ester [polysorbate]
(II) Amphoteric surface active agent
 (a) Carboxy betaine type
  (1) Alkyl betaine
   Alkyldimethyl betaine aminoacetate
   Alkyldimetyl betaine acetate
   Alkyldimetyl carboxymethyl betaine
   Alkyldimethyl carboxymethylene ammonium betaine
   Alklydimethyl ammoniumacetate
  (2) Fatty amide propyl betaine
   Fatty amide propyl dimethyl betaine aminoacetate
   Alkyl amide propyl betaine
   Alkyloyl amide propyl dimethyl glycine
   Alkanoyl aminopropyl dimethyl ammoniumacetate
   Palm oil fatty amide propyl betaine
   Palm oil fatty amide propyl dimethyl betaine aminoacetate The concentration of a surface active agent added to the etching solution in some cases may be should preferably be within a range of 2000 to 11000 ppm, and more preferably within a range of 4000 to 9700 ppm. A concentration of less than 2000 ppm is insufficient to reduce rapid reaction of the triazole type compound on the copper layer surface with the surface active agent so that it is difficult to form any uniform etching-inhibiting coating on the side walls of the copper pattern layer. On the other hand, a concentration of more than 11000 ppm is necessary and sufficient, or more than that, for reducing rapid reaction of the triazole type compound. The surface active agent of such concentration will produce excessive foams due to spray or the like, although its performance will not change so much.

Next, an example of the method of forming a copper circuit pattern on a resin substrate by etching with the etching solution according to the present invention will be described with reference to FIGS. 2(A) to 2(D).

Figure 2A:
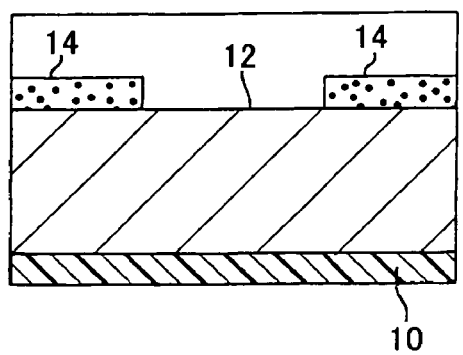
FIGS. 2(A) to 2(D) schematically illustrate etching of a copper layer with the etching solution according to the present invention.
Figure 2B:
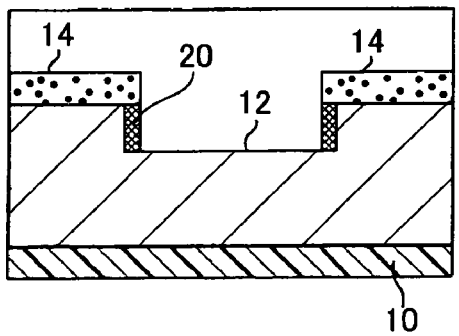
Figure 2C:
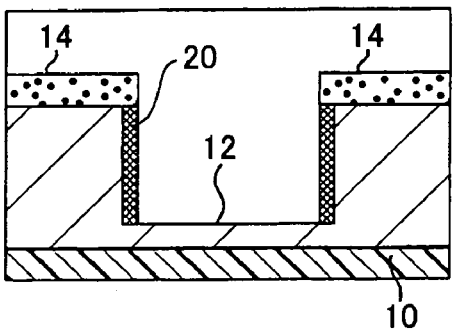

As shown in FIG. 2(A), a copper foil 12 is attached to a resin substrate 10. An etching resist 14 having a predetermined pattern is formed on the copper foil 12. Part of the copper foil, not covered with the etching resist 14, is solved and removed using the etching solution.

A well-known sprayer type etch apparatus is used to spray the etching solution according to the present invention in the form of shower to the surface of the copper foil or nearly perpendicularly to the surface of the copper foil 12. Thus, the etching solution is supplied to exposed part of the copper foil 12, not covered with the etching resist 14. The exposed part is etched (as in FIG. 2(B)).

The etch apparatus used in the present invention should preferably be a horizontal-conveyance etch apparatus including a conveyor to carry a printed wiring board into an etching zone, and a spray nozzle to spray the etching solution from above and below the printed wiring board under a spray pressure adjustable at a plurality of steps.

Etching is effected with the above etch apparatus at an etching-solution temperature of less than about 50° C., preferably, about 20 to 30° C., with the spray nozzle being set at a distance of 10 to 20 mm from a workpiece (resin substrate) and a spray pressure of 0.1 to 0.6 MPa for an etching time depending upon the thickness of the copper foil.

The etch apparatus used with the etching solution according to the present invention employs a slit nozzle (translational spray nozzle), and etching is effect using the nozzle located below the etch apparatus with the to-be-etched surface of the workpiece being directed downward.

Thus, the surface of the copper foil 12 is etched nearly perpendicularly thereto, while the cuprous chloride ions that will compose the etching-inhibiting coating increase in the vicinity of the side face of the etched copper layer laid below the edge of the etching resist 14 and react with the triazole type compound to form a complex (Cu-BTA complex or CuCl-BTA complex). Thus, an etching-inhibiting coating 20 will effectively be formed on the side face of the copper layer laid below the edge of the etching resist 14.

Note that since the etching solution will not stay at the bottom of the etched copper layer for a sufficient length of time for reaction of the additive in the etching solution with the copper, the possibility that the etching-inhibiting coating is formed is very low. The etching-inhibiting coating 20, if any formed, can effectively be separated or solved and removed under an external pressure (spray pressure) and/or flow of the etching solution or with supply of hydrochloric acid or the like that will solve and separate the etching-inhibiting coating 20 (Cu-BTA complex or CuCl-BTA complex).

Figure 2D:
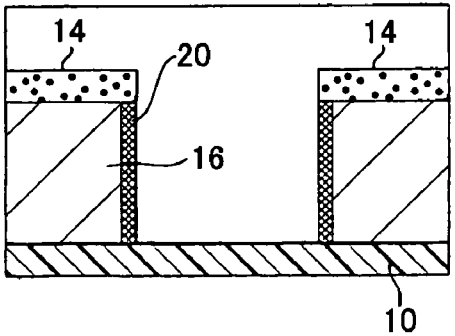

On the other hand, it is inferred that since on the side wall of the etched copper layer, the etching-inhibiting coating 20 is inhibited from being separated and solved under the influence of the above-mentioned external pressure and flow of the etching solution, so the etching-inhibiting coating 20 will effectively be formed and remain there. Thus, the bottom of the copper layer can efficiently be etched while the side wall of the copper layer is inhibited from being etched. Therefore, the directional etching as shown in FIG. 2(D) is possible. That is, etching can be made in a direction nearly perpendicular to the edge of the etching resist 14 with inhibition of the side etching.

The etching-inhibiting coating 20 solved and separated from the bottom of the etched copper layer is dissociated from the cuprous chloride under the action of the hydrochloric acid and restores its initial state.

According to the present invention, the etching solution may have a surface active agent added thereto. In this case, however, since some of surface active agents make bubbles undesired for etching, an antifoaming agent should desirably be mixed in the etching solution having the surface active agent added thereto.

Next, the reaction process in the etching with the etching solution according to the present invention will be described with reference to FIG. 3(B). In FIG. 3(B), "B" indicates a BTA compound and "K" indicates a surface active agent.

(1) $CuCl_2$ reacts with Cu in the copper foil to stay as 2CuCl on the copper foil surface.

At this time, the additive K(B) in the etching solution adsorbs Cu.

(2) $2CuCl_2$ reacts with 2HCl (included in the etching solution) to form a product and the product is released as a complex into the etching solution.

At this time, the additive K(B) reacts with $Cu^+$ to produce an etching-inhibiting coating ($Cu^+$+K(B)).

(3) $2CuCl_2^-$ is restored by replenished hydrogen peroxide to $2CuCl_2$.

At this time, the etching-inhibiting coating ($Cu^+$+K(B)) reacts with HCl to produce $CuCl_2^-$ and additive K(B). The additive returns to the process (1).

By repeating the processes (1) to (3) to inhibit horizontal etching, etching can be made downward perpendicularly to the edge of the etching resist.

FIG. 3(A) shows a process of reaction in etching using the conventional cupric chloride solution. As shown in FIG. 3(A), the reaction process is as follows:

(1) $CuCl_2$ reacts with Cu included in the copper foil and stays as 2CuCl on the surface of the copper foil.

(2) $2CuCl_2$ reacts with 2HCl to produce a complex which will be released into the etching solution.

(3) $2CuCl_2^-$ is restored by replenished hydrogen peroxide ($H_2O_2$) to $2CuCl_2$.

By repeating the processes (1) to (3) to inhibit vertical etching. However, etching will also go on horizontally because any additive that forms the etching-inhibiting coating as in the present invention is not included in the conventional etching solution.

The effect of the etching method using the etching solution according to the present invention will be described below in contrast with the etching method using the conventional cupric chloride etching solution with reference to FIG. 5.

Figure 5:
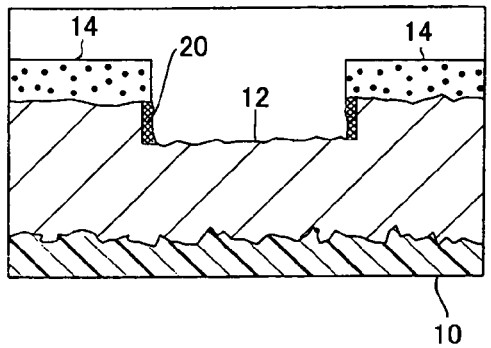
FIGS. 5(A1) to 5(A3) schematically illustrate the processes of etching with the etching solution according to the present invention, and FIGS. 5(B1) to 5(B3) schematically illustrate the processes of etching with the conventional etching solution.
Figure 5:
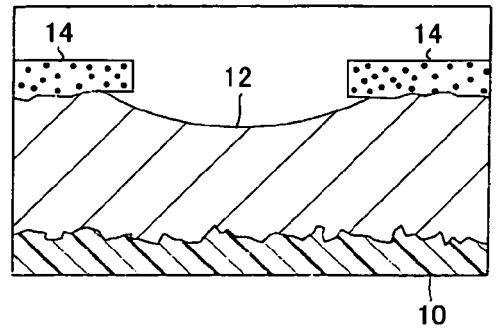
Figure 5:
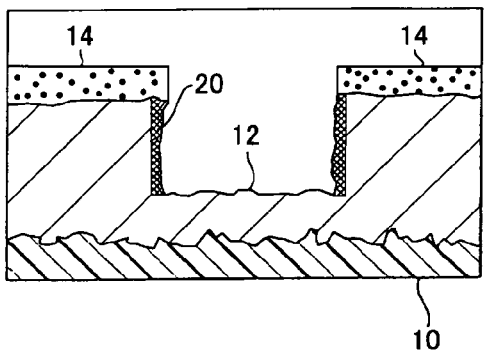
Figure 5:
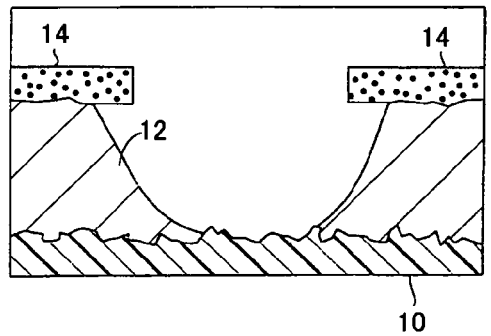
Figure 5:
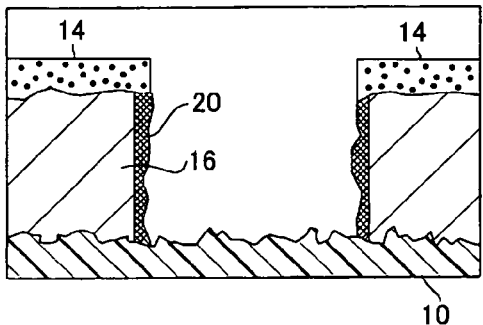
Figure 5:
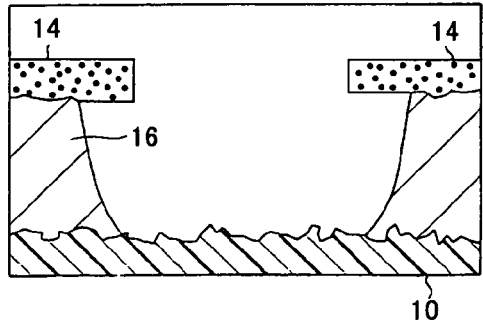

FIGS. 5(A1) to 5(A3) show the processes of etching with the etching solution according to the present invention, and FIGS. 5(B1) to 5(B3) show the processes of etching with the conventional cupric chloride etching solution.

In each drawing included in FIG. 5, an etching resist 14 having a nearly same pattern as that of a circuit pattern to be formed is provided on a copper foil 12, and parts of the copper layer exposed between the pattern traces of the etching resist 14 are etched to form a predetermined circuit pattern 16. These processes are illustrated as sectional views of a substrate.

FIGS. 5(A1) and 5(B1) are sectional views of the substrate having just started being etched, FIGS. 5(A2) and 5(B2) are sectional views of the substrate being etched, and FIGS. 5(A3) and 5(B3) show sectional views of the substrate having completely been etched.

As shown in FIGS. 5(B1) to 5(B3) showing the etching with the conventional cupric chloride etching solution, vertical etching and side etching go on simultaneously. On the other hand, as will be seen from FIGS. 5(A1) to 5(A3) showing the etching with the etching solution according to the present invention, vertical etching (in the direction, of depth) goes on while side etching is effectively being inhibited.

Note that for comparison in effect between the etching with the etching solution according to the present invention and etching with the conventional cupric chloride etching solution, the etching resist 14 laid on the copper foil 12 in the etching with the etching solution according to the present invention is equal in width to the etching resist 14 laid on the copper foil 12 in the etching with the conventional cupric chloride etching solution.

As seen from these drawings, the wiring patterns formed by the etching with the conventional etching solution incurs side etching and the etching solution according to the present invention, respectively, are equal in shape to each other, but the wiring pattern formed by the conventional etching method incurs side etching. However, the traces of the wiring pattern formed by the etching method according to the present invention can be formed to have a small width even with a small wiring pitch because the side etching is effectively inhibited.

Also, the etching solution according to the present invention in which the triazole type compound to inhibit the etching is added to the cupric chloride aqueous solution can effectively be used in a fine etching (etching of several micrometers) called "soft etching" as well.

A wiring pattern formed by the etching with the etching solution according to the present invention has formed with nonuniform pitches on the side wall thereof fine recesses, that is, fine irregularities, extending in a direction from the surface of the wiring pattern toward the substrate surface. The fine irregularities can improve the adhesion between the wiring pattern and an insulating resin layer laid over the wiring pattern.

That is, the nonuniform irregularities depend in shape and size upon the concentration of the triazole type compound included in the etching solution, concentration of the surface active agent or spray pressure. By stacking an insulating resin layer (adhesive layer) such as a resin film, prepreg, etc. and copper foil (circuit pattern) alternately on the surface, on which the wiring pattern is formed, of a printed wiring board having a wiring pattern having such irregularities formed on the side wall thereof, the printed wiring board will have an excellent adhesion between the conductor layer and insulating layer.

The nonuniform irregularities are comprised of primary depressions including many convexities (large ones) extending irregularly from the surface of the circuit pattern toward the substrate surface and concavities existing between the convexities, and secondary depressions including smaller irregularities existing between the concavities and convexities included in the primary depressions.

The distance between the large convexities, namely, the pitch of the primary depressions, should desirably be on the order of 5 to 20 μm, and distance between the large concavity and concavity, namely, the depth of the primary depressions, should desirably be on the order of 5 to 15 μm. Further, the distance from the convexity to concavity of the small irregularities, that is, the depth of the secondary depressions, should desirably be about ⅒ to ½ of the depth of the primary depressions.

The nonuniform irregularities are different from the roughness of a rough surface having uniform fine irregularities (distance between the convexities is on the order of 1 to 3 μm and depth between the top of convexity and bottom of concavity is also on the order of 1 to 3 μm) formed thereon by the roughing processing such as conventional blackening or Cz processing. Therefore, even after the entire surface of the circuit pattern is roughed by the blackening or Cz processing, the nonuniform irregularities have the shape and size thereof not largely varied just after the substrate is etched.

In the printed wiring board produced using the etching solution according to the present invention, uniform irregularities formed by roughing are provided on the side wall of the circuit pattern while the nonuniform irregularities are being almost maintained in shape and size, and uniform irregularities formed by roughing are provided on the surface (top) of the circuit pattern. Thus, the circuit pattern and insulating layer have a further improved adhesion between them.

To form an insulating resin layer that fills the space between the circuit patterns and cover each of the circuit patterns, a insulating resin layer such as a resin film, prepreg or the like should desirably be stacked on the upper surface of the circuit pattern and joined to the circuit pattern surface under a pressure applied to this lamination.

The above lamination method permits easy filling of the resin into the concavities in the roughed surface formed on the upper surface of the circuit pattern but no easy filling into the concavities in the roughed surface formed on the side wall. In the printed wiring board having a circuit pattern whose etch factor is large as in the present invention, the side wall of the circuit pattern will not easily be applied with any pressure, but the resin will easily fill in the concavities formed on the side wall of the circuit pattern because the concavities are wider than those formed by roughing.

Also, the nonuniform irregularities formed on the side wall of the circuit pattern as in the present invention are one step larger in size than the uniform irregularities formed on the roughed surface by the conventional roughing, and the primary depressions extending from the surface of the circuit pattern toward the substrate surface function to receive the insulating resin material. Thus, the resin will also enter the secondary depressions between the convexities and concavities included in the primary depressions.

Therefore, the insulating resin material easily enters the convexities of the irregularities formed on the side wall of the circuit pattern by the etching method according to the present invention, and thus the adhesion between the interlayer dielectric resin layer and circuit pattern is further improved.

Further, the present invention is applicable to a multilayer printed wiring board including a combination of a power conductor circuit (solid pattern) and ground conductor pattern (ground pattern). In this case, the power conductor circuit will have the characteristic impedance thereof reduced.

The circuit pattern having the nonuniform irregularities formed on the side wall thereof using the etching solution according to the present invention has an increased surface area of the side wall. Thus, when the power conductor circuit is adjacent to the ground conductor circuit, the insulating resin filled between the conductor circuits will have an increased capacitance. Therefore, the power conductor circuit will have the characteristic impedance thereof decreased with the result that a power can instantaneously be supplied to an IC chip mounted on the wiring board. Thus, it is possible to prevent the IC chip from malfunctioning.

A multilayer printed wiring board including such as power circuit pattern (including a plain layer) should preferably be 60 to 125 μm thick.

If the power circuit pattern is less than 60 μm in thickness, it will have an excessively large electrical resistance. If the thickness is over 125 μm, the multilayer printed wiring board itself will be thicker and so the wiring length be larger. In this case, the supply of a power to the IC chips on the wiring board will take too long a time.

Also, in the printed wiring board according to the present invention, a power circuit pattern may be provided on an internal layer of a multilayer core. The "multilayer core" refers herein to a core layer structure formed from at least three layers of circuit pattern including top, bottom and inner-layer ones and having a through-hole formed to penetrate the upper, top and inner-layer circuit patterns.

In a printed wiring board having such a multilayer core structure, since the capacitance between the through-hole electrically connected o the ground of an IC chip mounted on the wiring board and inner-layer power circuit pattern is large, the characteristic impedance of the power circuit pattern is decreased with the result that a power can instantaneously be supplied to the IC chip mounted on the wiring board and thus the IC chip be prevented from malfunctioning.

The present invention will further be described below concerning examples thereof:

EXAMPLE 1

(1) Preparing an Etching Solution

To a cupric chloride solution (cupric chloride of 2 to 2.2 mol/L in concentration and hydrochloric acid of 2 to 3 mol/L in concentration), BTA (benzotriazole) as a BTA compound was added in 800 ppm, and then alkyldimethyl betaine aminoacetate as amphoteric surface active agent and polyoxyethylene alkyl ether as anionic surface active agent was added in 5000 ppm in total to the mixture, to thereby prepare an etching solution.

To prepare the above etching solution, first BTA (benzotriazole) as BTA compound was added to a mixed aqueous solution of amphoteric and anionic surface active agents and then the mixture was agitated until BTA was completely solved in the aqueous solution containing the surface active agents, thereby preparing an additive. This additive was added to the cupric chloride solution to prepare the etching solution.

(2) Forming an Etching Resist Layer

A 70 μm-thick copper foil to form a copper wiring pattern was attached to one side of a 100 μm-thick glass epoxy substrate, an etching resist was applied to the copper foil surface, the etching resist was exposed to light with a photomask having a predetermined circuit pattern pre-formed thereon being placed thereon, and unexposed parts of the etching resist were solved for removal, to thereby prepare a substrate having an etching resist layer having a pattern identical to the predetermined circuit pattern.

The etching resist pattern formed on the copper foil surface on the substrate is a line pattern having a trace width L of 100 μm and trace interval S of 100 μm (L/S=100 μm/100 μm).

(3) Etching, and Removing the Etching Resist

The substrate prepared in step (2) was carried into a horizontal-conveyance etch apparatus provided with a plurality of spray nozzles whose spray pressure is adjustable with the side of the substrate prepared in step (2), where the copper foil was attached, being directed downward. The substrate was etched with the etching solution prepared in step (1), sprayed from the nozzles provided at the lower portion of the etch apparatus, under the following conditions to form an inner-layer conductor circuit having a circuit pattern nearly identical to the etching resist pattern. Thereafter, the substrate thus etched was rinsed with flowing water, and immersed in a NaOH aqueous solution of about 2% to remove the etching resist. Next, the inner-layer conductor circuit was subjected to blackening process.

Etching Conditions:

| | |
|---|---|
| Distance between nozzle and substrate | 100 mm |
| Spray pressure | 0.2 to 0.25 MPa |
| Etching temperature | 25° C. |
| Etching time | 420 to 480 sec |

(4) Stacking a Prepreg and Copper Foil

Next, on the substrate having the inner-layer conductor circuit formed by the etching in step (3), there were stacked together three prepregs each of 45 μm-thick glass epoxy material and a 70 μm-thick copper foil by hot pressing at 180° C. under a pressure of 4.5 MPa.

(5) Forming an Etching Resist Layer

The etching resist was applied to the copper foil surface stacked in step (4), the etching resist was exposed to light with a photomask having a predetermined circuit pattern pre-formed thereon being placed thereon, and unexposed parts of the etching resist were solved for removal, to thereby form an etching resist layer having a pattern identical to the predetermined circuit pattern formed in step (2).

(6) Etching, and Removing the Etching Resist

The substrate was etched under the same conditions as in step (3) above. The substrate thus etched was rinsed with flowing water, and immersed in a NaOH aqueous solution of about 2% to remove the etching resist, thereby producing a printed wiring board having an outer-layer conductor circuit having a circuit pattern nearly identical to the etching resist pattern.

EXAMPLE 2

A printed wiring board was produced similarly to the example 1 except that an etching solution was prepared without adding any surface active agent and the spray pressure included in the etching conditions was 0.5 to 0.6 MPa.

Note that to prepare the above etching solution, the additive was prepared by adding a predetermined amount of BTA to a KOH aqueous solution of pH 13, for example, and agitating the mixture until BTA was completely solved in the KOH. This additive was added to the cupric chloride solution to prepare the etching solution.

EXAMPLE 3

A printed wiring board was produced similarly to the example 1 except that BTA as the BTA compound was added in 1005 ppm to the cupric chloride solution.

EXAMPLE 4

A printed wiring board was produced similarly to the example 3 except that an etching solution was prepared without adding any surface active agent and the spray pressure included in the etching conditions was 0.5 to 0.6 MPa.

EXAMPLE 5

A printed wiring board was produced similarly to the example 1 except that BTA as the BTA compound was added in 1200 ppm to the cupric chloride solution.

EXAMPLE 6

A printed wiring board was produced similarly to the example 5 except that an etching solution was prepared without adding any surface active agent and the spray pressure included in the etching conditions was 0.5 to 0.6 MPa.

EXAMPLE 7

A printed wiring board was produced similarly to the example 1 except that BTA as the BTA compound was added in 1800 ppm to the cupric chloride solution.

EXAMPLE 8

A printed wiring board was produced similarly to the example 7 except that an etching solution was prepared without adding any surface active agent and the spray pressure included in the etching conditions was 0.5 to 0.6 MPa.

EXAMPLE 9

A printed wiring board was produced similarly to the example 1 except that BTA as the BTA compound was added in 2500 ppm to the cupric chloride solution.

EXAMPLE 10

A printed wiring board was produced similarly to the example 9 except that an etching solution was prepared without adding any surface active agent and the spray pressure included in the etching conditions was 0.5 to 0.6 MPa.

EXAMPLE 11

A printed wiring board was produced similarly to the example 1 except that BTA as the BTA compound was added 3000 ppm to the cupric chloride solution.

EXAMPLE 12

A printed wiring board was produced similarly to the example 11 except that an etching solution was prepared without adding any surface active agent and the spray pressure included in the etching conditions was 0.5 to 0.6 MPa.

EXAMPLE 13

A printed wiring board was produced similarly to the example 1 except that BTA as the BTA compound was added in 3500 ppm to the cupric chloride solution.

EXAMPLE 14

A printed wiring board was produced similarly to the example 13 except that an etching solution was prepared without adding any surface active agent and the spray pressure included in the etching conditions was 0.5 to 0.6 MPa.

EXAMPLE 15

A printed wiring board was produced similarly to the example 5 except that surface active agent (alkyldimethyl betaine aminoacetate as amphoteric surface active agent and polyoxyethylene alkyl ether as anionic surface active agent in total) was added in 1500 ppm to the cupric chloride solution.

EXAMPLE 16

A printed wiring board was produced similarly to the example 15 except that surface active agent was added in 2000 ppm to the cupric chloride solution.

EXAMPLE 17

A printed wiring board was produced similarly to the example 15 except that surface active agent was added in 4000 ppm to the cupric chloride solution.

EXAMPLE 18

A printed wiring board was produced similarly to the example 15 except that surface active agent was added in 7000 ppm to the cupric chloride solution.

EXAMPLE 19

A printed wiring board was produced similarly to the example 15 except that surface active agent was added in 9700 ppm to the cupric chloride solution.

EXAMPLE 20

A printed wiring board was produced similarly to the example 15 except that surface active agent was added in 11000 ppm to the cupric chloride solution.

EXAMPLE 21

A printed wiring board was produced similarly to the example 15 except that surface active agent was added in 12000 ppm to the cupric chloride solution.

EXAMPLE 22

A printed wiring board was produced similarly to the example 9 except that surface active agent (alkyldimethyl betaine aminoacetate as amphoteric surface active agent and polyoxyethylene alkyl ether as anionic surface active agent in total) was added in 1500 ppm to the cupric chloride solution.

EXAMPLE 23

A printed wiring board was produced similarly to the example 22 except that surface active agent was added in 2000 ppm to the cupric chloride solution.

EXAMPLE 24

A printed wiring board was produced similarly to the example 22 except that surface active agent was added in 4000 ppm to the cupric chloride solution.

EXAMPLE 25

A printed wiring board was produced similarly to the example 22 except that surface active agent was added in 7000 ppm to the cupric chloride solution.

EXAMPLE 26

A printed wiring board was produced similarly to the example 22 except that surface active agent was added in 9700 ppm to the cupric chloride solution.

EXAMPLE 27

A printed wiring board was produced similarly to the example 22 except that surface active agent was added in 11000 ppm to the cupric chloride solution.

EXAMPLE 28

A printed wiring board was produced similarly to the example 22 except that surface active agent was added in 12000 ppm to the cupric chloride solution.

EXAMPLE 29

A printed wiring board was produced similarly to the example 6 except that the spray pressure was 0.2 to 0.25 MPa.

EXAMPLE 30

A printed wiring board was produced similarly to the example 8 except that the spray pressure was 0.2 to 0.25 MPa.

EXAMPLE 31

A printed wiring board was produced similarly to the example 10 except that the spray pressure was 0.2 to 0.25 MPa.

EXAMPLE 32

A printed wiring board was produced similarly to the example 12 except that the spray pressure was 0.2 to 0.25 MPa.

EXAMPLE 33

A printed wiring board was produced similarly to the example 3 except that the spray pressure was 0.1 to 0.2 MPa.

EXAMPLE 34

A printed wiring board was produced similarly to the example 5 except that the spray pressure was 0.1 to 0.2 MPa.

EXAMPLE 35

A printed wiring board was produced similarly to the example 7 except that the spray pressure was 0.1 to 0.2 MPa.

EXAMPLE 36

A printed wiring board was produced similarly to the example 9 except that the spray pressure was 0.1 to 0.2 MPa.

EXAMPLE 37

A printed wiring board was produced similarly to the example 11 except that the spray pressure was 0.1 to 0.2 MPa.

EXAMPLE 38

A printed wiring board was produced similarly to the example 3 except that the spray pressure was 0.5 to 0.6 MPa.

EXAMPLE 39

A printed wiring board was produced similarly to the example 5 except that the spray pressure was 0.5 to 0.6 MPa.

EXAMPLE 40

A printed wiring board was produced similarly to the example 7 except that the spray pressure was 0.5 to 0.6 MPa.

EXAMPLE 41

A printed wiring board was produced similarly to the example 9 except that the spray pressure was 0.5 to 0.6 MPa.

EXAMPLE 42

A printed wiring board was produced similarly to the example 11 except that the spray pressure was 0.5 to 0.6 MPa.

EXAMPLES 43 TO 84

A printed wiring board was produced similarly to the examples 1 to 42 except that a mixture of BTA and TTA was used in stead of BTA as the BTA compound.

EXAMPLES 85 TO 126

A printed wiring board was produced similarly to the examples 1 to 42 except that BTA-COOH was used in stead of BTA as the BTA compound.

COMPARATIVE EXAMPLE 1

A printed wiring board was produced similarly to the example 1 except that a cupric chloride solution having no BTA compound and surface active agent was used as the etching solution and the etching temperature was 30° C.

COMPARATIVE EXAMPLE 2

A printed wiring board was produced similarly to the example 1 except that a cupric chloride solution having no BTA compound and surface active agent was used as the etching solution and the etching temperature was 40° C.

COMPARATIVE EXAMPLE 3

A printed wiring board was produced similarly to the example 1 with the additives disclosed in the Japanese Patent Application Laid Open No. 057453 of 1994 being added to a cupric chloride solution. As in the example, 2-aminobenzothiazole was added in 0.1% by mass, diethylene glycol was in 1.0% by mass, and diethylene triamine was in 1.0% by mass.

The printed wiring boards produced as the examples 1 to 126 and comparative examples 1 to 3 were evaluated by the following evaluation tests (1) to (3). The test results are shown in Tables 1 and 2.

Note that the results of evaluation of the examples 43 to 84 and 85 to 126 were the same as those of the examples 1 to 42 shown in Tables 1 and 2, and so they will be omitted.

Further, the example 1 and comparative example 1 was observed with a magnification of 500 times by an ultra-deep shape measuring microscope (VK-8500 by the Keyenth) for the surface roughness of the side wall of the wiring pattern formed with the etching solution. The test results are shown in FIGS. 9(A) and 10(A).

Also, the surface roughness of the side wall of the wiring pattern CZ-processed (roughed) after being etched is shown in FIGS. 9(B) and 10(B), and the surface roughness of the side wall of the wiring pattern blackened (roughed) after being etched is shown in FIGS. 9(C) and 10(C).

TABLE 1

| Example No. | Concentration of triazole type compound (ppm) | Concentration of surface active agent (ppm) | Spray pressure (MPa) | Test results ||||
|---|---|---|---|---|---|---|---|
| | | | | Etch factor (F) | Side-etching inhibition (E) (%) | Insulation resistance | Cooling/heating cycle resistance |
| 1 | 800 | 5000 | 0.2-0.25 | 2.8 | Δ | ○ | ○ |
| 2 | 800 | 0 | 0.5-0.6 | 2.5 | Δ | ○ | ○ |
| 3 | 1005 | 5000 | 0.2-0.25 | 5.8 | ○ | ○ | ○ |
| 4 | 1005 | 0 | 0.5-0.6 | 5.4 | ○ | ○ | ○ |
| 5 | 1200 | 5000 | 0.2-0.25 | 8.8 | ◎ | ○ | ○ |
| 6 | 1200 | 0 | 0.5-0.6 | 10.0 | ◎ | ○ | ○ |
| 7 | 1800 | 5000 | 0.2-0.25 | 8.8 | ◎ | ○ | ○ |
| 8 | 1800 | 0 | 0.5-0.6 | 7.8 | ◎ | ○ | ○ |
| 9 | 2500 | 5000 | 0.2-0.25 | 8.8 | ◎ | ○ | ○ |
| 10 | 2500 | 0 | 0.5-0.6 | 8.2 | ◎ | ○ | ○ |
| 11 | 3000 | 5000 | 0.2-0.25 | 6.4 | ○ | ○ | ○ |
| 12 | 3000 | 0 | 0.5-0.6 | 5.8 | ○ | ○ | ○ |
| 13 | 3500 | 5000 | 0.2-0.25 | 2.5 | Δ | ○ | ○ |
| 14 | 3500 | 0 | 0.5-0.6 | 2.3 | Δ | ○ | ○ |
| 15 | 1200 | 1500 | 0.2-0.25 | 2.8 | Δ | ○ | ○ |
| 16 | 1200 | 2000 | 0.2-0.25 | 5.8 | ○ | ○ | ○ |
| 17 | 1200 | 4000 | 0.2-0.25 | 8.0 | ◎ | ○ | ○ |
| 18 | 1200 | 7000 | 0.2-0.25 | 7.8 | ◎ | ○ | ○ |
| 19 | 1200 | 9700 | 0.2-0.25 | 9.6 | ◎ | ○ | ○ |
| 20 | 1200 | 11000 | 0.2-0.25 | 6.1 | ○ | ○ | ○ |
| 21 | 1200 | 12000 | 0.2-0.25 | 2.7 | Δ | ○ | ○ |
| 22 | 2500 | 1500 | 0.2-0.25 | 2.5 | Δ | ○ | ○ |
| 23 | 2500 | 2000 | 0.2-0.25 | 6.0 | ○ | ○ | ○ |

TABLE 2

| Example No. | Concentration of triazole type compound (ppm) | Concentration of surface active agent (ppm) | Spray pressure (MPa) | Test results ||||
|---|---|---|---|---|---|---|---|
| | | | | Etch factor (F) | Side-etching inhibition (E) (%) | Insulation resistance | Cooling/heating cycle resistance |
| 24 | 2500 | 4000 | 0.2-0.25 | 7.8 | ◎ | ○ | ○ |
| 25 | 2500 | 7000 | 0.2-0.25 | 8.8 | ◎ | ○ | ○ |
| 26 | 2500 | 9700 | 0.2-0.25 | 8.3 | ◎ | ○ | ○ |
| 27 | 2500 | 11000 | 0.2-0.25 | 6.8 | ○ | ○ | ○ |
| 28 | 2500 | 12000 | 0.2-0.25 | 2.6 | Δ | ○ | ○ |
| 29 | 1200 | 0 | 0.2-0.25 | 6.1 | ○ | ○ | ○ |
| 30 | 1800 | 0 | 0.2-0.25 | 5.8 | ○ | ○ | ○ |
| 31 | 2500 | 0 | 0.2-0.25 | 6.0 | ○ | ○ | ○ |

TABLE 2-continued

|  | Concentration of triazole type compound (ppm) | Concentration of surface active agent (ppm) | Spray pressure (MPa) | Test results | | | |
|---|---|---|---|---|---|---|---|
|  |  |  |  | Etch factor (F) | Side-etching inhibition (E) (%) | Insulation resistance | Cooling/heating cycle resistance |
| 32 | 3000 | 0 | 0.2-0.25 | 2.6 | Δ | ○ | ○ |
| 33 | 1005 | 5000 | 0.1-0.2 | 5.8 | ○ | ○ | ○ |
| 34 | 1200 | 5000 | 0.1-0.2 | 7.8 | ⊚ | ○ | ○ |
| 35 | 1800 | 5000 | 0.1-0.2 | 8.8 | ⊚ | ○ | ○ |
| 36 | 2500 | 5000 | 0.1-0.2 | 7.2 | ⊚ | ○ | ○ |
| 37 | 3000 | 5000 | 0.1-0.2 | 5.4 | ○ | ○ | ○ |
| 38 | 1005 | 5000 | 0.5-0.6 | 5.2 | ○ | ○ | ○ |
| 39 | 1200 | 5000 | 0.5-0.6 | 9.2 | ⊚ | ○ | ○ |
| 40 | 1800 | 5000 | 0.5-0.6 | 9.6 | ⊚ | ○ | ○ |
| 41 | 2500 | 5000 | 0.5-0.6 | 8.1 | ⊚ | ○ | ○ |
| 42 | 3000 | 5000 | 0.5-0.6 | 5.3 | ○ | ○ | ○ |
| Comparative example No. |  |  |  |  |  |  |  |
| 1 | 0 | 0 | 0.2-0.25 | 1 | 0% | X | X |
| 2 | 0 | 0 | 0.2-0.25 | 1 | Standard | X | X |
| 3 | — | — | 0.2-0.25 | 2 | 50% | X | X |

(1) Measuring the Etch Factor and Side-Etching Inhibition

The section of each of the printed wiring boards as the examples 1 to 126 and comparative examples 1 to 3 was observed using a scanning electron microscope (JSM-6300 by the Nippon Denshi Datum). The size B of the section of a circuit pattern 12 in a position of contact with a substrate 10, and size T of the section of the circuit pattern 12 in a position of contact with an etching resist 13 after etched, as shown in FIG. 8 were measured. An etch factor and side-etching inhibition E (%) were determined based on the measurements B and T.

The side-etching inhibitions E (%) in the examples, thus determined, are shown with symbols "⊚", "○" and "Δ", respectively, in Table 1. It should be noted that the "⊚" indicate a side-etching inhibition E over 85% and under 95%, "○" indicates a side-etching inhibition E over 80% and under 85%, and "Δ" indicates a side-etching inhibition E over 55% and under 65%.

In the circuit pattern formed in each of the examples produced using the etching solution according to the present invention, the difference (B–T) between the section sizes B and T is nearly equal to a side etching S. On the assumption that sections sizes corresponding to the section sizes B and T (in FIG. 8), respectively, in the examples 1 to 126 and comparative example 3 are taken as $B_1$ and $T_1$ while sections sizes corresponding to the section sizes B and T (in FIG. 8), respectively, in the comparative examples 1 or 2 are taken as $B_0$ and $T_0$ and the thickness of the circuit pattern is taken as H, a value given by the following equation (1) is defined as the etch factor (F) and a value given by the following equation (2) is defined as the side-etching inhibition E (%):

$$F = H/(B_1 - T_1) \text{ or } H/(B_0 - B_0) \quad (1)$$

$$E(\%) = 100 \times [1 - (B_1 - T_1)/(B_0 - T_0)] \quad (2)$$

The side-etching inhibiting performance of the etching solution according to the present invention in which the additive is added to cupric chloride solution can be evaluated taking the side-etching inhibition E (%) as an index, and it is considered that a larger E value indicates a higher performance of side-etching inhibition.

Note that in each of the examples 1 to 126, the circuit pattern had a thickness H of 70 μm and a trace width/inter-trace distance) of 100 μm/100 μm. Also in the comparative examples 1 to 3, the thickness H of the circuit pattern was 70 μm.

(2) Insulation Resistance

A current flowing when a voltage of 3 V was applied between two adjacent circuit patterns in each of the printed wiring boards as the examples 1 to 126 and comparative examples 1 to 3 was measured, and an insulation resistance was determined based on the measured current.

Note that in Table 1, an insulation resistance between the adjacent circuit patterns, less than $10^{-7}$ A is indicated with a symbol "○", and an insulation resistance over $10^{-7}$ A is indicated with a symbol "x".

(3) Cooling/Heating Cycle Resistance

Each of the printed wiring boards as the examples 1 to 126 and comparative examples 1 to 3 was subjected to a cooling/heating cycle (thermal cycle). After that, the printed wiring board was visually inspected and observed with a magnification of 10 times using an optical microscope to see if there was separation between the circuit pattern and interlayer dielectric resin layer.

Heating at 125° C. for 8 hours, cooling at −55° C. for 30 min, heating at 125° C. for 30 min and cooling at −55° C. for 30 min were taken as one cooling/heating cycle. This was done repeatedly 10 times. Then, the test piece was heated at a temperature of 85° C. and humidity of 85% for 19 hours and then reflowed 10 times at 260° C.

Note that in Table 1, a good result without any separation is indicated with a symbol "○" and a no-good result with a separation is indicated with a symbol "x"

As seen from Table 1 showing the test results, the etch factor of the comparative examples 1 to 3 was 1 to 2, while that of the examples 1 to 126 as 2.3 to 10. Also, the side-etching inhibition in the examples 1 to 126 of the present invention was 55 to 90% when the amount of side-etching in the comparative example 2 was taken as a standard value. The side-etching inhibition in the comparative example 3 was 50%.

More specifically, when etching was effected under a spray pressure of 0.1 to 0.6 MPa with the etching solution containing the triazole type compound of 1000 to 3000 ppm in concentration, the etch factor was 5.4 to 10 and side-etching inhibition was 80 to 90%. As will be seen, the examples 1 to 126 of the present invention are considerably superior in etch factor and side-etching inhibition to the comparative examples 1 to 3.

Also, the examples 1 to 126 of the present invention showed a good insulation resistance between the adjacent circuit patterns and no separation between the circuit pattern and insulating resin layer covering the circuit pattern. That is, the examples 1 to 126 are also superior in adhesion (electrical connection) to the comparative examples 1 to 3.

Further, as shown in FIGS. 9(A) to 9(C) and FIGS. 10(A) to 10(C), the fine irregularities formed on the side wall of the wiring pattern using the etching solution according to the present invention are more than 4 times larger in surface roughness (Rmax) than those formed with the conventional cupric chloride etching solution. The pitch of the primary depressions was on the order of 5 to 20 μm, and depth of the primary depressions was found to be within a range of 5 to 15 μm. In addition, the depth of the secondary depressions was found to be about ⅒ to ½ of that of the primary depressions.

Moreover, it was revealed from the test results that even the roughing such as blackening, Cz processing or the like made, if applied, over the surface of the circuit pattern led to no large variation in shape and size of the nonuniform irregularities of the circuit pattern just after etched.

EXAMPLE 127

Figure 11:
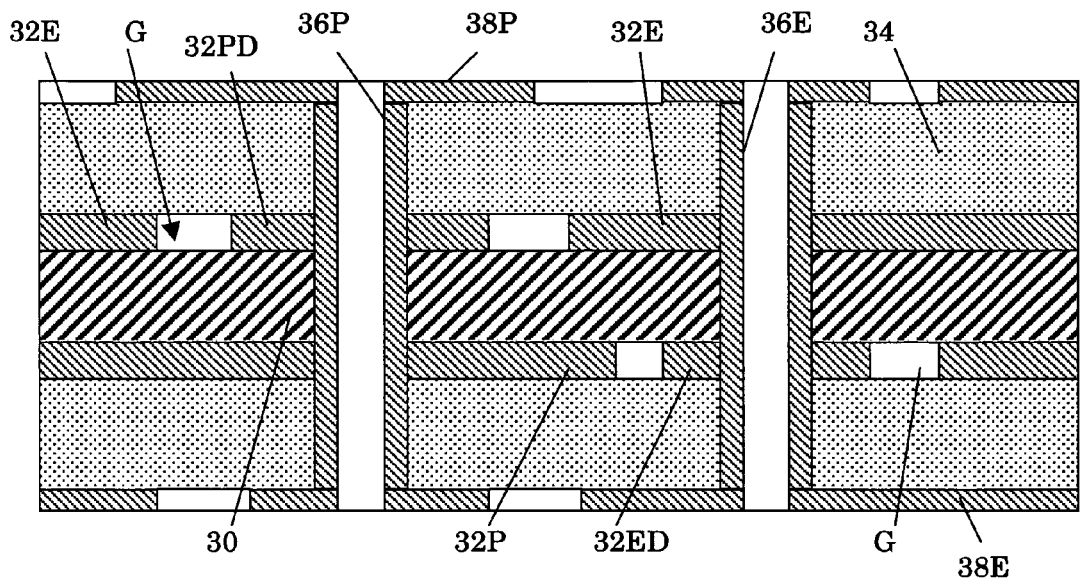
FIG. 11 is a schematic sectional view of a multilayer core substrate produced according to the example 127 of the present invention.

A printed wiring board was produced in which a power conductor circuit (flat pattern) and ground conductor circuit (ground pattern) are disposed coexisting with each other on a conductor layer at the same level in a multilayer core substrate, for example, an inner-layer conductor circuit (as shown in FIG. 11).

To produce such a multilayer core substrate, first a copper foil 32 attached to a core substrate 30 is etched with the etching solution according to the present invention to form a power layer, for example, a power conductor circuit (flat pattern) 22P and ground conductor circuit 32ED (ground pattern), on an inner-layer conductor layer at the same level.

Next, conductor circuits 32P, 32ED, 32PD and 32E are covered by the well-known method and an interlayer dielectric resin layer 34 is provided on the conductor layers. A through-hole 36P, for example, is formed by drilling through the interlayer dielectric resin layer 34, inner-layer conductor circuits 32P and 32ED and core substrate 30, and a conductor layer is formed by electroless copper plating or electric copper plating of the inner wall of the through-hole and surface of the interlayer dielectric resin layer 34. Further, an etching resist is formed on the conductor layer, then parts of the conductor layer, not covered with the etching resist, is removed with the etching solution, and by the etching method, according to the present invention, and the etching resist layer is separated to form outer-layer conductor circuits 38P and 38E and also through-holes 36P and 36E that electrically connect the inner conductor circuits 32P and 32E and outer conductor circuits 38P and 38E to each other.

A buildup wiring layer as disclosed in the Japanese Patent Application Laid Open No. 266078 of 1999 is stacked on the multilayer core substrate thus formed, and they are joined to each other to produce a multilayer printed wiring board. The multilayer printed wiring board has a holed solder resist layer formed on the outermost conductor circuit by the well-known method, and solder pieces such as solder bumps are formed on parts of the conductor circuit surface exposed through the holes in the solder resist layer. An electronic part such as IC chip is mounted on the printed wiring board on contact with the solder pieces.

The etching solution and etching method according to the present invention can effectively be used in the process of producing the multilayer printed wiring board, especially, in the process of forming the power conductor circuit 32P and ground conductor circuit 32E on the core substrate 30.

Figure 12A:
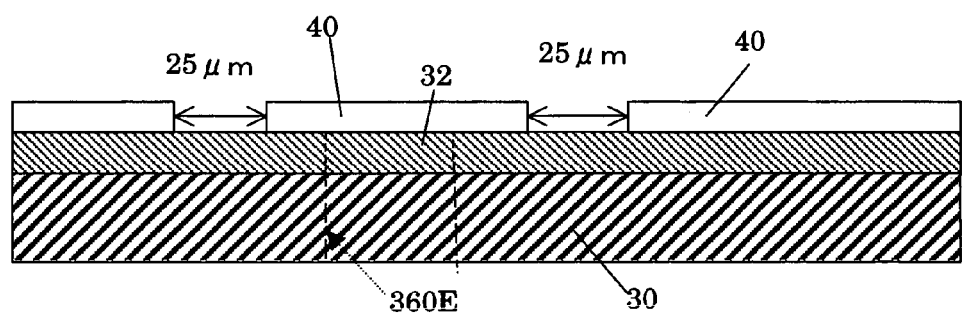
FIGS. 12(A) and 12(B) explain the method of forming, using the etching solution according to the present invention, a power conductor circuit and ground conductor circuit in the same conductor layer of the multilayer core substrate shown in FIG. 11.

To form such a conductor circuit, a resist film is first attached to the 70 μm-thick copper foil 32, exposed to light and developed to form an etching resist layer 40 as shown in FIG. 12(A).

On the etching resist layer 40, a region of 25 μm in width where no resist is formed is provided in a position corresponding to a gap G provided to prevent a short-circuit from occurring between the ground conductor circuit 32E and power conductor circuit 32P connected to the through-holes 36E electrically connected to the ground of the IC. It should be noted that in FIG. 12, the position (indicated with a dashed line) where the through-hole 36E is to be formed is indicated with a reference numeral 360E.

Figure 12B:
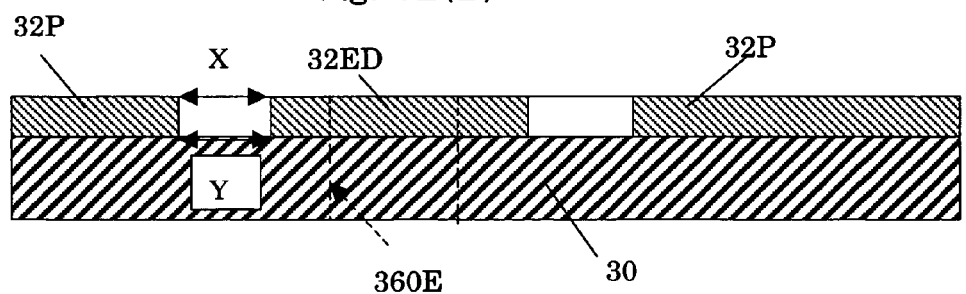

Thereafter, etching was done with the etching solution and under the etching conditions as in the example 5 to form the power conductor circuit 32P (32PD) and ground conductor circuit 32ED (32E) on the core substrate 30 (as in FIG. 12(B)).

The distance X of separation between the power conductor circuit 32P and ground conductor circuit 32ED, formed with the etching solution according to the present invention, (distance between the top ends of the power and ground conductor circuits) and distance Y (distance between the bottom ends of the power and ground conductor circuits) were measured using a graduated microscope of 10 to 100 times in magnification. The measured distances X and Y were 32 μm and 25 μm (etch factor F=10 and side-etching inhibition E=90%).

Note that the etching solution and etching method according to the present invention may be applied to forming an outer-layer conductor circuit in a multilayer core substrate or to forming a core substrate from a both-side copper-clad laminate that is not any multilayer core substrate.

COMPARATIVE EXAMPLE 4

A multilayer printed wiring board was produced similarly to the example 127 except that the etching solution and etching conditions used for producing the comparative example 2 were adopted. As the result, the measured distances X and Y were 95 μm and 25 μm (etch factor F=1.0 and side-etching inhibition E=Standard value).

An IC chip of 3.2 GHz in driving frequency and 1066 MHz in bus clock (FSB) was mounted on each of the multilayer printed wiring boards as the example 127 and comparative example 4. The multilayer printed wiring boards were turned on at the same time and checked to see if they malfunctioned.

The test results showed no malfunction in the example 127, but a malfunction in the comparative example 4. It is inferred that since the etch factor F was large in the example 127, the conductor layer had a larger volume than when the conventional etching solution was used and thus the conductor layer had the electrical resistance thereof reduced so that the voltage at the IC did not easily drop. Also, it is inferred that because of the large etch factor F, the side face of the power conductor circuit and that of the ground conductor circuit were disposed in vicinity of and opposite to each other, whereby the power circuit had the characteristic impedance thereof reduced. Further, it is inferred that since the pitch and depth of the irregularities formed on the side face of the conductor circuit using the etching solution according to the present invention were larger than those when the conventional etching solution was adopted, the surface area of the side face of the conductor circuit became larger with the result that he capacitance between the power source and ground was increased while the characteristic impedance of the power conductor circuit became further lower, whereby the multilayer printed wiring board according to the present invention was prevented from malfunctioning.

INDUSTRIAL APPLICABILITY

As having been described in the foregoing, the etching solution according to the present invention is extremely excellent in effect of side-etching inhibition. Use of this etching solution permits to provide a printed wiring board having a very fine wiring pattern formed on a substrate hereof.

The invention claimed is:

1. An etching solution comprising:
    a solution of cupric chloride and at least one triazole type compound added to the cupric chloride solution; and
    at least one amphoteric surface active agent selected from the group consisting of alkyldimethyl betaine aminoacetate, alkyldimethyl betaine acetate, alkyldimetyl carboxymethyl betaine, alkyldimethyl carboxymethylene ammonium betaine, alklydimethyl ammoniumacetate, fatty amide propyl dimethyl betaine aminoacetate, alkyl amide propyl betaine, alkyloyl amide propyl dimethyl glycine, alkanoyl aminopropyl dimethyl ammonium acetate, palm oil fatty amide propyl betaine and palm oil fatty amide propyl dimethyl betaine aminoacetate.

2. The etching solution of claim 1, wherein the at least one triazole type compound is selected from the group consisting of benzotriazole, benzotriazole-COOH and tolyl triazole.

3. The etching solution according to claim 1, wherein the concentration of the at least one triazole type compound is over 1000 ppm and under 3000 ppm.

4. The etching solution according to claim 1, wherein the concentration of the at least one triazole type compound is in a range of from 1200 to 2500 ppm.

5. The etching solution according to claim 1, wherein the concentration of the at least one amphoteric surface active agent ranges from 2000 to 11000 ppm.

6. The etching solution of claim 1, wherein the concentration of the at least one amphoteric surface active agent ranges from 4000 to 9700 ppm.

7. A method of etching exposed parts of a copper layer, wherein parts of the copper layer are coated with an etching resist having a predetermined pattern, wherein the parts of the copper layer not coated with the etching resist are exposed, using an etching solution, comprising:
    applying, to parts of the copper layer exposed between traces of the etching resist pattern, an etching solution comprising a solution comprising cupric chloride and at least one triazole type compound to etch the exposed parts of the copper layer;
    wherein an inhibiting coating is selectively formed on the parts of the copper layer coated with the etching resist; and
    wherein the etching solution comprises at least one amphoteric surface active agent selected from the group consisting of alkyldimethyl betaine aminoacetate, alkyldimethyl betaine acetate, alkyldimetyl carboxymethyl betaine, alkyldimethyl carboxymethylene ammonium betaine, alklydimethyl ammoniumacetate, fatty amide propyl dimethyl betaine aminoacetate, alkyl amide propyl betaine, alkyloyl amide propyl dimethyl glycine, alkanoyl aminopropyl dimethyl ammonium acetate, palm oil fatty amide propyl betaine and palm oil fatty amide propyl dimethyl betaine aminoacetate.

8. The method of claim 7, wherein the etching solution further comprises at least one anionic surface active agent.

9. The etching method according to claim 7, wherein the at least one triazole type compound is selected from the group consisting of benzotriazole, benzotriazole-COOH and tolyl triazole.

10. The etching method according to claim 7, wherein the concentration of the at least one triazole type compound is over 1000 ppm and under 3000 ppm.

11. The etching method according to claim 7, wherein the concentration of the at least one triazole type compound is in a range of 1200 to 2500 ppm.

12. The etching method of claim 7, wherein the concentration of the at least one amphoteric surface active agent ranges from 2000 to 11000 ppm.

13. The etching solution according to claim 7, wherein the concentration of the at least one amphoteric surface active agent ranges from 4000 to 9700 ppm.

14. A printed wiring board having a circuit pattern formed by the etching method of claim 7, wherein on the side wall of the circuit pattern, there are formed nonuniform irregularities having a shape and size that depend upon the concentration of the at least one triazole type compound added to the etching solution, the concentration of the surface active agent or spray pressure of the etching solution.

15. The printed wiring board according to claim 14, wherein the nonuniform irregularities are comprised of primary depressions including convexities extending irregularly from the surface of the circuit pattern toward the surface of a substrate and concavities existing between the convexities, and secondary depressions including smaller irregularities existing between the concavities and convexities included in the primary depressions.

16. The printed wiring board according to claim 15, wherein:
    the primary depressions comprise a pitch of from 5 to 20 µm; and
    wherein the primary depressions comprise a depth of from 5 to 15 µm.

17. The printed wiring board according to claim 15, wherein the primary and secondary depressions comprise a depth, and wherein the depth of the secondary depressions is $\frac{1}{10}$ to $\frac{1}{2}$ of the depth of the primary depressions.

* * * * *